United States Patent

Suzuki

[11] Patent Number: 6,132,937
[45] Date of Patent: Oct. 17, 2000

[54] ALKALI-DEVELOPING TYPE PHOTOCURABLE COMPOSITION AND CALCINED PATTERN OBTAINED BY USE THEREOF

[75] Inventor: Nobuyuki Suzuki, Tsurugashima, Japan

[73] Assignee: Taiyo Ink Manufacturing Co., Ltd., Tokyo, Japan

[21] Appl. No.: 09/265,827

[22] Filed: Mar. 10, 1999

[30] Foreign Application Priority Data

Mar. 13, 1998 [JP] Japan ................... 10-080508

[51] Int. Cl.$^7$ ............... G03C 1/725; G03C 1/73; G03C 5/56
[52] U.S. Cl. ................... 430/285.1; 430/281.1; 430/908; 430/910; 430/18; 430/325; 430/330
[58] Field of Search ............... 430/285.1, 281.1, 430/908, 910, 18, 330, 325; 522/81, 83, 96, 149, 165

[56] References Cited

U.S. PATENT DOCUMENTS

| | | | |
|---|---|---|---|
| 4,501,767 | 2/1985 | Iimure | 522/81 |
| 5,209,688 | 5/1993 | Nishigaki et al. | 445/24 |
| 5,821,031 | 10/1998 | Hashimoto et al. | 430/18 |
| 5,851,732 | 12/1998 | Kanda et al. | 430/321 |
| 5,858,616 | 1/1999 | Tanaka et al. | 430/281.1 |

FOREIGN PATENT DOCUMENTS

| | | |
|---|---|---|
| 1-296534 | 11/1989 | Japan. |
| 2-165538 | 6/1990 | Japan. |
| 5-342992 | 12/1993 | Japan. |
| 10087769 | 4/1998 | Japan. |

OTHER PUBLICATIONS

Derwent West Abstract for JP 10087769A (Satoshi et al.) Derwent Access # 1998–336352, Apr. 7, 1998.

Chemical Abstract (CA) Abstract for JP 10087769A(Satoshi et al) Access # 128:271282 CA, Apr. 7, 1998.

JAPIO Abstract for JP 10087769A (Satoshi et al.) Access # 98–087769 JAPIO, Apr. 7, 1998.

*Primary Examiner*—Janet Baxter
*Assistant Examiner*—Sin J. Lee
*Attorney, Agent, or Firm*—Ronald P. Kananen; Rader, Fishman & Grauer

[57] ABSTRACT

Disclosed are a photocurable composition which is developable with an aqueous alkaline solution and such calcined patterns as a conductor pattern, a vitreous dielectric pattern, and a fluorescent pattern which are obtained by the use of the photocurable composition. The photocurable composition comprises (A) an alkali-soluble macromolecular binder having a weight-average molecular weight in the range of 5,000 to 100,000 and an acid value in the range of 50 to 150 mg KOH/g and obtained by causing (c) an organic acid possessing one carboxyl group and no ethylenically unsaturated bond in its molecule to react with the glycidyl group of a copolymer of (a) a compound possessing an ethylenically unsaturated bond and possessing neither hydroxyl group nor acidic group and (b) glycidyl (meth)acrylate and then causing (d) a polybasic acid anhydride to react with the resultant secondary hydroxyl group, (B) an inorganic powder, (C) a photopolymerizable monomer, (D) a photopolymerization initiator, and (E) an organic solvent. The composition may be in the form of paste or in the form of a dry film. When the photocurable composition is in the form of paste, the paste is applied to a substrate and then dried to form a film. When the photocurable composition is in the form of a dry film, the film is laminated on the substrate. A calcined pattern of high fineness is obtained by patterning the superposed layer of the composition by selective exposure to light and development, and thereafter calcining the patterned film.

20 Claims, 2 Drawing Sheets

ALKALI-DEVELOPING TYPE PHOTOCURABLE COMPOSITION AND CALCINED PATTERN OBTAINED BY USE THEREOF

BACKGROUND OF THE INVENTION

1. Field of the Invention

This invention relates to a photocurable composition which is developable with an aqueous alkaline solution and is applicable particularly advantageously to the formation of a conductor circuit pattern, a barrier rib pattern, a dielectric pattern, a fluorescent pattern, and a black matrix on the front and the back substrate of a plasma display panel, and applicable also to the formation of an electric conductor, a resister, and a dielectric element for use in a fluorescent display tube and electronic parts. This invention also relates to such calcined patterns as a conductor pattern, a vitreous dielectric pattern, and a fluorescent pattern which are obtained by the use of the photocurable composition.

2. Description of the Prior Art

A plasma display panel (hereinafter abbreviated as "PDP") is a planar display for exhibiting pictures and pieces of information by utilizing the light emitted by plasma discharge. It is classified under the DC type and the AC type according to the structure of panel and the mode of driving. The principle of color display by the PDP consists in generating plasma discharge in cells (discharge spaces) between two opposed electrodes severally formed on a front glass substrate and a back glass substrate separated by intervening ribs (barriers), and exciting the phosphor formed on the inner surface of the back glass substrate with the ultraviolet light generated by the discharge of such a gas as He or Xe sealed in the cells thereby inducing generation of visible lights of three primary colors. The cells in the DC type PDP are divided by the component ribs of a lattice, whereas those in the AC type PDP are divided by the ribs which are parallelly arranged on the face of the substrate. In either case, the cells are divided by ribs.

FIG. 1 illustrates a typical construction of the planar discharge type PDP using a three-electrode structure for full color display. On the lower face of a front glass substrate 1, many pairs of display electrodes 2a, 2b each comprising a transparent electrode 3a or 3b intended for discharge and a bus electrode 4a or 4b intended for lowering the line resistance of the transparent electrode are formed. On the display electrodes 2a, 2b, a transparent dielectric layer 5 (low melting glass) for accumulating electric charge is formed by printing and calcination. A protective layer (MgO) 6 is formed thereon by vacuum deposition. The protective layer 6 assumes the role of protecting the display electrodes and maintaining the state of discharge.

On a back glass substrate 7, ribs (barriers) 8 shaped like stripes and adapted to partition discharge spaces and address electrodes (data electrodes) 9 severally disposed in the discharge spaces are formed with prescribed pitches. On the inner faces of discharge spaces, fluorescent films of the three colors, i.e. red (10a), green (10b), and blue (10c), are laid out regularly. In the full color display, the fluorescent films of the three primary colors of red, green, and blue mentioned above jointly form one picture element.

The PDP described above is called a "planar discharge system" because an AC pulse voltage is applied between the pair of display electrodes 2a, 2b to induce discharge between the electrodes on one and the same substrate. It has a construction such that the ultraviolet light generated by discharge excites the fluorescent films 10a, 10b, and 10c of the back substrate 7 and the visible light consequently generated is seen through the transparent electrodes 3a, 3b of the front substrate 1 (reflection type).

In recent years, the front substrate and back substrate of the PDP, the electrode circuit substrate of a printed circuit board, and the like have been witnessing steady advance of the patterns formed thereon toward higher fineness. In consequence of this trend, the desirability of improving the technique for the formation of such patterns has been finding growing approval. Particularly, the plasma display panels have been undergoing conspicuous technological innovations devoted to enlarging size and enhancing resolution. The manufacturers of plasma display panels have recently succeeded in commercializing such panels of the 50-inch class and have been continuing an effort to produce such panels in a larger size with higher resolution.

Heretofore, the conductor patterns and dielectric patterns in plasma display panels, fluorescent display tubes, electronic parts, etc. have been generally formed by the screen printing process which uses an electroconductive paste or a glass paste containing a very large amount of metal powder or glass powder. The formation of such patterns by the screen printing process, however, entails such problems as requiring skill on the part of workers, exposing the layer of fresh paint deposited by printing to the possibility of sustaining blurs or blots, degrading the accuracy of registration of printed patterns due to expansion and contraction of the screen, and jagging the formed pattern due to the contact with the screen mesh. Thus, the screen printing process produces required patterns only with a poor yield and incurs difficulty in coping with the trend of patterns toward higher fineness and the trend of plasma display panels toward enlargement of size. In the circumstances, the desirability of developing a pattern processing material which is capable of more stably coping with the demand for patterns of higher fineness and for panels of larger size has been finding recognition.

As a prospective alternative for the screen printing process, therefore, the photolithographic process has been proposed in published Japanese Patent Application, KOKAI (Early Publication) No. (hereinafter referred to briefly as "JP-A-") 1-296,534, JP-A-2-165,538, and JP-A-5-342,992, for example. The photolithographic process forms a pattern by applying an ultraviolet-curable glass paste to an insulating substrate and exposing and developing the coating of paste. It is generally known to use a macromolecular compound containing carboxyl groups for the purpose of rendering a given composition developable with an aqueous alkaline solution. When the macromolecular compound containing carboxyl groups is made to incorporate such a fine basic inorganic powder as glass frit, however, the paste consequently obtained acquires too inferior viscosity stability to fit practical use. Specifically, the glass paste composition of such inferior viscosity stability entails deterioration of the operational efficiency of coating work and degradation of the developing properties of the applied coating in consequence of such phenomena as gelation and decline of flowability and consequently brings the problem of affording no sufficient allowance in work.

SUMMARY OF THE INVENTION

The present invention, conceived in the light of such problems of prior art as described above, has for a primary object thereof the provision of an alkali-developing type photocurable composition which is excellent in storage stability (viscosity stability), operational efficiency of coating work, and developability with an aqueous alkaline solution notwithstanding an extremely large content of a fine inorganic powder and, at the same time, capable of forming a pattern of high fineness and high aspect ratio without giving rise to curls (warps) or peeling along the pattern edges during the course of calcining.

A further object of the present invention is to provide an alkali-developing type photocurable composition which enjoys an excellent calcining properties, permits use of a relatively low temperature for the purpose of calcining, and exhibits stable fastness of adhesion to a substrate invariably at the steps of drying, exposure to light, development, and calcining.

A more concrete object of the present invention is to provide an alkali-developing type photocurable composition which permits formation of a conductor circuit pattern, a vitreous dielectric pattern, or a fluorescent pattern of high fineness with satisfactory workability and high productivity by the photolithographic technique, and undergoes a calcining step at a temperature of not more than 600° C. infallibly without giving rise to a calcining residue capable of exerting an adverse effect on an image.

Another object of the present invention is to provide a calcined pattern of high fineness manufactured with high productivity from the photocurable composition mentioned above through a series of selective exposure to light, development, and calcining and a technique for the manufacture.

To accomplish the objects mentioned above, the first aspect of the present invention resides in providing a photocurable composition developable with an aqueous alkaline solution, which composition is characterized by containing (A) an alkali-soluble macromolecular binder having a weight-average molecular weight in the range of 5,000 to 100,000 and an acid value in the range of 50 to 150 mg KOH/g and obtained by causing (c) an organic acid possessing one carboxyl group and no ethylenically unsaturated bond in its molecule to react with the glycidyl group of a copolymer of (a) a compound possessing an ethylenically unsaturated bond and possessing neither hydroxyl group nor acidic group and (b) glycidyl (meth)acrylate and then causing (d) a polybasic acid anhydride to react with the resultant secondary hydroxyl group, (B) an inorganic powder, (C) a photopolymerizable monomer, (D) a photopolymerization initiator, and (E) an organic solvent. Preferably, the inorganic powder (B) mentioned above has a low melting glass frit account for a portion of not less than 5% by weight thereof.

The photocurable composition of the present invention may be in the form of paste or in the form of a dry film produced in advance from the composition in the form a film.

In the case of the pasty form, a photocurable and electroconductive past composition is produced by chiefly using a fine metallic powder as the inorganic powder (B) and a photocurable glass paste composition is produced by exclusively using glass powder. The paste composition for use in the black matrix additionally contains a black pigment.

Another aspect of the present invention resides in providing a calcined pattern formed of the photocurable composition described above. When the photocurable composition is in the form of paste, for example, the pasty photocurable composition is applied to a substrate and then dried to form a film. When the photocurable composition is in the form of a dry film, the dry film is laminated on the substrate. A calcined pattern of high fineness is obtained by patterning the superposed layer of the composition by selective exposure to light and development, and thereafter calcining the patterned film.

The calcined pattern which is formed as described above serves as a conductor pattern when a fine metallic powder is used as the inorganic powder (B) mentioned above or a vitreous dielectric pattern when a glass powder is used instead. Optionally, a fluorescent pattern may be formed by using a fluorescent powder as the inorganic powder.

BRIEF DESCRIPTION OF THE DRAWINGS

Other objects, features, and advantages of the invention will become apparent from the following description taken together with the drawings, in which.

DETAILED DESCRIPTION OF THE INVENTION

Figure 1:
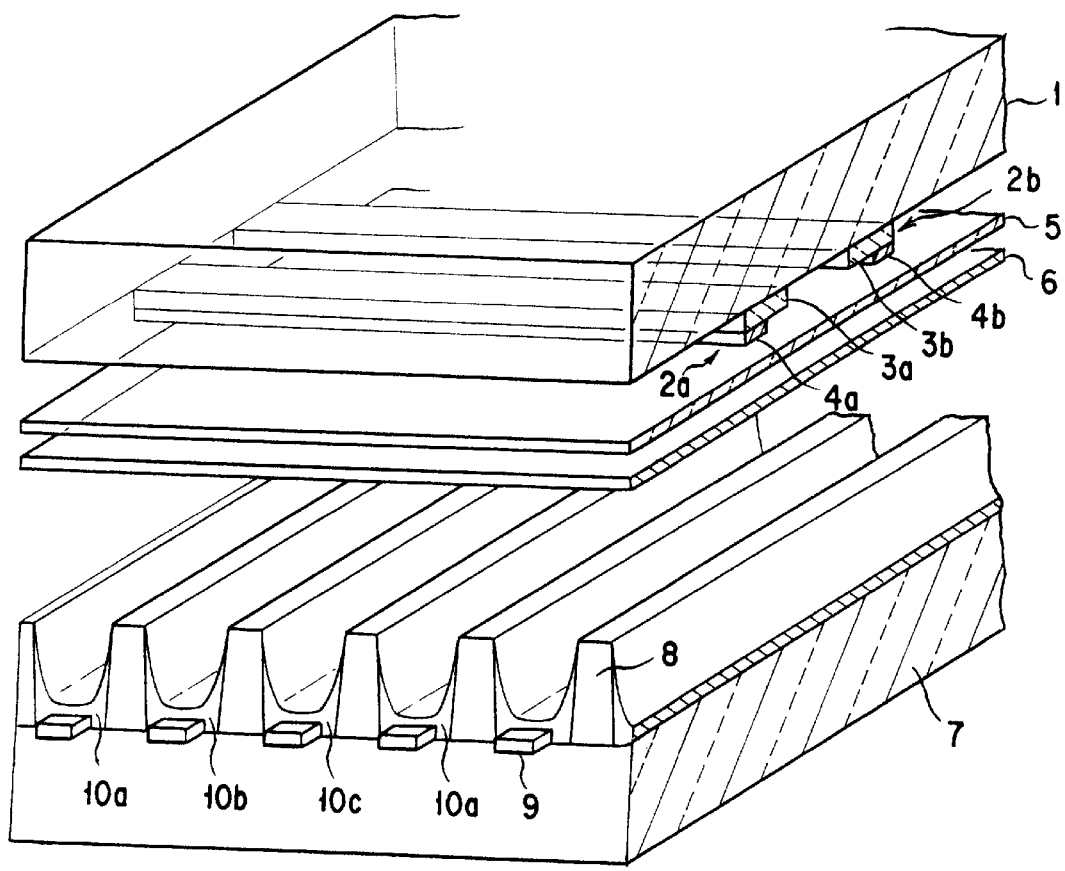
FIG. 1 is a fragmentary exploded perspective view of the AC type PDP of the planar discharge system.

The conventional alkali-developing type photocurable paste composition possesses very poor storage stability (viscosity stability) and entails deterioration of the operational efficiency of coating work and degradation of the developing properties of the applied coating in consequence of such phenomena as gelation and decline of flowability of the composition as described above and consequently brings the problem of compelling the operating conditions to be set in a very narrow range.

The present inventors, therefore, have tried addition of an organic acid or an inorganic acid to the composition for the purpose of repressing the reaction of fine basic inorganic particles with carboxyl groups of a macromolecular compound, only to discover that this measure, though capable of repressing the phenomenon of gelation, brings such disadvantages as degrading the dryness to touch of the applied coating after drying, subsequently exhibiting inferior working properties, and suffering occurrence of pin holes in the drawn pattern and chippings in the pattern lines.

The present inventors, after further continuing a diligent study with a view to solving these problems, have discovered that a photocurable paste composition exhibiting excellent storage stability is obtained by endowing the carboxyl groups of an alkali-soluble macromolecular binder with steric hindrance thereby repressing the contact of the carboxyl groups with fine basic inorganic particles.

Specifically, the photocurable composition of the present invention is characterized by using, as a binder for an inorganic powder, (A) an alkali-soluble macromolecular binder having a weight-average molecular weight in the range of 5,000 to 100,000 and an acid value in the range of 50 to 150 mg KOH/g and obtained by causing (c) an organic acid possessing one carboxyl group and no ethylenically unsaturated bond in its molecule to react with the glycidyl group of a copolymer having as a main chain thereof (a) a compound such as an alkyl (meth)acrylate or a substituted or unsubstituted styrene which possesses an ethylenically unsaturated bond and possessing neither hydroxyl group nor acidic group and (b) glycidyl (meth)acrylate and then subjecting the resultant secondary hydroxyl group to undergo an addition reaction with (d) a polybasic acid anhydride. This macromolecular binder (A) contains carboxyl groups in the side chains thereof, it is soluble in an aqueous alkaline solution. The film which is formed of the photocurable composition of the present invention, therefore, can be stably developed with an aqueous alkaline solution after selective exposure to light. Since the introduction of the carboxyl group is initiated by causing the organic acid to react with the pendant glycidyl group of the copolymer mentioned above and carried out by the addition reaction of the polybasic acid anhydride to the secondary hydroxyl group positioned near the main chain, the carboxyl group is linked to a site of the side chain approximating closely to the main chain and, owing to the steric hindrance between the main chain and the side chain, precluded from contacting the fine basic inorganic particles. The composition which contains such an alkali-soluble macromolecular binder as mentioned above in conjunction with the fine inorganic particles, therefore, exhibits outstanding storage stability and very rarely incurs alteration of viscosity or induces gelation during the course of storage.

When the photocurable composition of the present invention is intended to form glass paste, a low melting glass powder is used as the inorganic powder (B) mentioned above. Even when such other inorganic powder as metal powder is used for forming electroconductive paste, the incorporation of the low melting glass powder in an amount of not less than 5% by weight proves advantageous. The presence of the low melting glass powder enables the composition to be calcined at a temperature of not more than 600° C. and enhances the fastness of adhesion of the calcined pattern to a substrate.

As a result, the photocurable composition of the present invention permits a pattern of high fineness to be easily formed on a substrate of a large surface area by the photolithographic technique without entailing such problems as suffering degradation of stability of storage and impairment of the operational efficiency of coating work owing to the gelation or the decline of flowability of the composition, fully allows the calcining step performed at a temperature of not more than 600° C., and realizes a marked improvement of the yield.

Now, the components of the photocurable composition of the present invention will be described in detail below.

As the monomer components of the backbone polymer of the alkali-soluble macromolecular binder (A) for use in the present invention, (a) the compound possessing an ethylenically unsaturated bond and possessing neither hydroxyl group nor acidic group, besides (b) glycidyl (meth)acrylate, is used. As concrete examples of such compounds, alkyl (meth)acrylates such as methyl (meth)acrylate, ethyl (meth) acrylate, and isobornyl (meth)acrylate; and unsubstituted or substituted styrenes such as styrene, chlorostyrene, and α-methylstyrene may be cited. These compounds can be used either singly or in the form of a combination of two or more members. The expression "(meth)acrylate" as used in the present specification is a term for referring collectively to acrylate and methacrylate.

As concrete examples of the aforementioned organic acid (c) which possesses one carboxyl group and no ethylenically unsaturated double bond in its molecule, alkylcarboxylic acids having 2 to 17 carbon atoms such as acetic acid, propionic acid, n-butyric acid, iso-butyric acid, n-dimethylbutyric acid, ethylbutyric acid, hexanoic acid, 2-methylpentanoic acid, 2-ethylpentanoic acid, heptanoic acid, 2-methylheptanoic acid, lauric acid, stearic acid, and n-heptadecanoic acid, or substituted or unsubstituted benzoic acid, and aromatic group-containing alkylcarboxylic acids such as (R),(S)-2-phenylpropionic acid, (R)-phenylisopropionic acid, 2-phenylbutyric acid, and 4-phenylbutyric acid may be cited. These organic acids may be used either singly or in the form of a combination of two or more members.

As concrete examples of the aforementioned polybasic acid anhydride (d), maleic anhydride, succinic anhydride, phthalic anhydride, tetrahydrophthalic anhydride, hexahydrophthalic anhydride, methyltetrahydrophthalic anhydride, methylhexahydrophthalic anhydride, methylendomethylenetetrahydrophthalic anhydride, endomethylenetetrahydrophthalic anhydride, chlorendic anhydride, and trimellitic anhydride may be cited. These polybasic acid anhydrides can be used either singly or in the form of a combination of two or more members.

The copolymerization reaction of (a) the aforementioned compound possessing an ethylenically unsaturated bond and possessing neither hydroxyl group nor acidic group with (b) the glycidyl (meth)acrylate easily proceed in the presence of a radical polymerization catalyst such as azobisisobutyronitrile or organic peroxides. It can be carried out as by the standard method of solution polymerization at a temperature in the approximate range of 40° to 130° C., thereby giving rise to a random copolymer.

The addition reaction of the aforementioned organic acid (c) to the glycidyl group in the side chain of the copolymer obtained as described above and the esterification reaction of the saturated or unsaturated polybasic acid anhydride (d) to the secondary hydroxyl group produced by the above addition reaction are preferred to use a catalyst capable of promoting the reaction. As concrete examples of the catalyst to be advantageously used herein, triethylamine, benzyldimethylamine, methyltriethylammonium chloride, tetrabutylammonium bromide, benzyltrimethylammonium bromide, benzyltrimethylammonium iodide, triphenylphosphine, triphenylstibine, chromium octanoate, and zirconium octanoate may be cited. Preferably, the amount of such a catalyst to be used is in the range of 0.1 to 10% by weight of the reaction mixture. The temperatures of the addition reaction and the esterification reaction mentioned above are preferred to be in the range of 60° to 120° C. Incidentally, the ratio of the reaction of the polybasic acid anhydride (d) to the secondary hydroxyl group is preferred to be adjusted such that the acid value of the carboxyl group-containing polymer to be produced as described above may fall in the range of 50 to 150 mg KOH/g.

The alkali-soluble macromolecular binder (A) mentioned above can be used advantageously when the weight-average molecular weight thereof falls in the range of 5,000 to 100,000, preferably 6,000 to 30,000, and the acid value thereof falls in the range of 50 to 150 mg KOH/g, preferably 60 to 100 mg KOH/g. If the molecular weight of the macromolecular binder (A) is less than 5,000, the binder will bring an adverse effect on the fastness of adhesion of the coating layer to a substrate during the course of development. Conversely, if the molecular weight exceeds 100,000, the binder will tend to impair the operation of development. If the acid value of the binder is less than 50 mg KOH/g, the solubility of the binder in an aqueous alkaline solution will be insufficient and the development will tend to prove defective. Conversely, if the acid value exceeds 150 mg KOH/g, the fastness of adhesion of the coating layer will be degraded and the photo-cured part (exposed part) will tend to produce dissolution during the course of development.

Preferably the alkali-soluble macromolecular binder (A) described above is incorporated into the composition in a proportion in the range of 5 to 50% by weight, based on the total amount of the composition. If the amount of the macromolecular binder to be incorporated accounts for a proportion smaller than the lower limit of the range mentioned above, the distribution of the resin mentioned above in the formed coating will tend to become ununiform and the formation of a pattern of high fineness by the selective exposure to light and development will become difficult. Conversely, if the amount is larger than the upper limit of the range, the excess will bring such disadvantages as deflecting the pattern or causing contraction of line width during the course of calcining.

As concrete examples of the inorganic powder (B) to be used in formulating the photocurable composition of the present invention as an electroconductive paste, fine metal particles (B-1) or mixtures of such fine metal particles with fine glass particles (B-2) may be cited.

Examples of the fine metal particles (B-1) include gold, silver, copper, palladium, platinum, aluminum, nickel, and alloys thereof, for example. The metal powders mentioned above may be used either singly or in the form of a combination of two or more members. From the viewpoint of resolution, the metal powder is preferred to have an average particle diameter of not more than 10 $\mu$m, preferably not more than 5 $\mu$m. These metal particles in the form of spheres, blocks, flakes, and dendrites may be used either singly or in the form of a combination of two or more members. In order for these metal particles to be prevented from oxidation, improved in dispersibility in the composition, and allowed to acquire a stabilized developing properties, particularly particles of Ag, Ni, or Al are preferred to be treated with a fatty acid. As concrete examples of the fatty acid which is usable for this treatment, oleic acid, linolic acid, linolenic acid, and stearic acid may be cited.

Properly, the amount of the metal powder to be incorporated is in the range of 25 to 1,000 parts by weight, based on 100 parts by weight of the aforementioned alkali-soluble macromolecular binder (A). If the amount of the metal powder to be incorporated is less than 25 parts by weight, the shortage will tend to cause contraction of line width of the conductor circuit or breakage of the line. Conversely, if the amount exceeds 1,000 parts by weight, the excess will impair the permeation of light and render the impartation of sufficient photo-curing properties to the composition difficult.

For the purpose of enabling the film formed after calcining to acquire enhanced strength and exhibit improved fastness of adhesion to the substrate, a glass powder (B-2) which will be specifically described hereinbelow may be additionally incorporated in an amount in the range of 5 to 30 parts by weight, based on 100 parts by weight of the metal powder.

A low melting glass frit having a softening point in the range of 300° to 600° C. is used as the glass powder (B-2) which is needed when the photocurable composition of the present invention is formulated as glass paste. The species of low melting glass frit which use lead oxide, bismuth oxide, or zinc oxide as a main component are advantageously adopted herein. The low melting glass frit which is used favorably herein has a glass transition point in the range of 300° to 550° C. and a thermal expansion coefficient, $\alpha_{300}$, in the range of 70–90×10$^{-7}$/° C. From the viewpoint of resolution, the glass frit has an average particle diameter of not more than 10 $\mu$m, preferably not more than 2.5 $\mu$m.

Properly, the amount of the glass powder to be incorporated is in the range of 25 to 1,000 parts by weight, based on 100 parts by weight of the alkali-soluble macromolecular binder (A) mentioned above.

One preferable example of the glass powder containing lead oxide as the main component thereof is an amorphous frit which is composed of (in percent by weight of oxide basis) 48–82% of PbO, 0.5–22% of $B_2O_3$, 3–32% of $SiO_2$, 0–12% of $Al_2O_3$, 0–10% of BaO, 0–15% of ZnO, 0–2.5% of $TiO_2$, and 0–25% of $Bi_2O_3$ and has a softening point in the range of 420–590° C. One preferable example of the glass powder containing bismuth oxide as the main component thereof is an amorphous frit which is composed of (in percent by weight of oxide basis) 35–88% of $Bi_2O_3$, 5–30% of $B_2O_3$, 0–20% of $SiO_2$, 0–5% of $Al_2O_3$, 1–25% of BaO, and 1–20% of ZnO and has a softening point in the range of 420–590° C.

One preferable example of the glass powder containing zinc oxide is an amorphous frit which is composed of (in percent by weight of oxide basis) 25–60% of ZnO, 2–15% of $K_2O$, 25–45% of $B_2O_3$, 1–7% of $SiO_2$, 0–10% of $Al_2O_3$, 0–20% of BaO, and 0–10% of MgO and has a softening point in the range of 420–590° C.

When the paste requires to have a black color tone, it may incorporate therein a black pigment formed of a metal oxide or a complex metal oxide containing one or more metals selected from among Fe, Co, Cu, Cr, Mn, and Al as main components thereof. From the viewpoint of the degree of blackness, the preferred black pigment has an average particle diameter of not more than 1.0 $\mu$m, preferably not more than 0.6 $\mu$m.

As the inorganic powder (B-3) which is used when the photocurable composition of the present invention is formulated as fluorescent paste, various fluorescent powder may be used, depending on the purpose of application. For example, a long-afterglow fluorescent substance possessed of a sort of ceramic structure and obtained by mixing the oxide of at least one metallic element selected from the elements belonging to Groups IIa, IIIa, and IIIb in the Periodic Table of the Elements such as, for example, calcium oxide, strontium oxide, barium oxide, alumina, or cerium oxide with at least one rare earth element selected from among Sc, Y, La, Ce, Pr, Nd, Sm, Eu, Gd, Tb, Dy, Ho, Er, Tm, Yb, and Lu as an activating agent or coactivating agent and sintering the resultant mixture and a fluorescent substance formed of a sulfide of zinc or an alkali earth as a typical phosphorescent material may be used. Generally, (Y,Gd)BO$_3$:Eu (borates of yttrium and gadolinium having europium as a fluorescent center; emitting a red color), Zn$_2$SiO$_4$:Mn (zinc silicate having manganese as a fluorescent center, emitting a green color), BaO.6Al$_2$O$_3$:Mn (emitting a green color), BaMgAl$_{14}$O$_{23}$:Eu (barium magnesium aluminate having europium as a fluorescent center, emitting a blue color), and BaMgA$_{10}$O$_{17}$:Eu (emitting a blue color) are used for the fluorescent layer of a plasma display panel. Properly, such a fluorescent powder has an average particle diameter of not more than 10 microns, preferably not more than 5 microns. The amount of the fluorescent powder to be incorporated is the same as the metal powder mentioned above.

A fine ceramic powder may be cited as another fine inorganic powder (B-4) which can be incorporated in the photocurable composition of the present invention. As the ceramic substance for this fine ceramic powder, it is proper to use one or more compounds selected from among alumina, cordierite, and zircon. From the standpoint of the degree of resolution, the ceramic powder properly has an average particle diameter of not more than 10 $\mu$m, preferably not more than 2.5 $\mu$m.

Since the inorganic powder having an average particle diameter of not more than 10 microns is advantageously used in the present invention, it is preferred for the purpose of preventing secondary agglomeration and improving dispersibility in the composition to have undergone a preliminary surface treatment with an organic acid, an inorganic acid, a silane coupling agent, a titanate-based coupling agent, or an aluminum-based coupling agent to an extent not so large as to impair the quality of the inorganic powder or to have incorporated therein the treating agent mentioned above at the time the photocurable composition is converted into a paste. The method for treating the inorganic powder is preferred to comprise the steps of dissolving such a surface-treating agent as mentioned above in an organic solvent or water, stirring the resultant solution with the inorganic powder added thereto, distilling the produced blend thereby expelling the solvent by distillation, and heat-treating the residue of the distillation at a temperature in the approximate range of 50 to 200° C. for a period of not less than two hours.

Examples of the photopolymerizable monomers (C) include, but are not limited to: diethylene glycol diacrylate, triethylene glycol diacrylate, polyethylene glycol diacrylate, nonanediol diacrylate, polyurethane diacrylate, trimethylolpropane triacrylate, pentaerythritol triacrylate, pentaerythritol tetraacrylate, ethylene oxide-modified trimethylolpropane triacrylate, dipentaerythritol pentaacrylate, dipentaerythritol tetraacrylate; methacrylates corresponding to the acrylates enumerated above; mono-, di-, tri-, and higher polyesters of polybasic acids with hydroxyalkyl (meth)acrylates; and mono-, di-, tri-, and higher polyesters of polybasic acids with hydroxyl group-containing polyvalent (meth)acrylate monomers. These monomers may be used either singly or in the form of a combination of two or more members.

The amount of the photopolymerizable monomer (C) mentioned above to be incorporated in the composition is generally proper in the range of 1 to 200 parts by weight, preferably in the range of 20 to 100 parts by weight, based on 100 parts by weight of the alkali-soluble macromolecular binder (A) mentioned above from the viewpoint of promoting the photo-curing of the composition.

Examples of the photopolymerization initiators (D) mentioned above include, but are not limited to: benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropan-1-one and 2-benzyl-2-dimethylamino-1-(4-morpholinophenyl)-butan-1-one; anthraquinones such as 2-methylanthraquinone, 2-ethylanthraquinone, 2-t-butylanthraquinone, 1-chloroanthraquinone, and 2-amylanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone; xanthones; phosphine oxides such as (2,6 -dimethoxybenzoyl)-2,4,4-pentyl phosphine oxide, bis(2,4,6-trimethylbenzoyl)-phenyl phosphine oxide, and ethyl-2,4,6-trimethylbenzoyl-phenyl phosphinate; various peroxides; and 1,7-bis(9-acridinyl)heptane. These well known and widely used photopolymerization initiators may be used either singly or in the form of a combination of two or more members. The ratio of incorporation of the photopolymerization initiator (D) is preferred to be in the range of 1 to 20 parts by weight, based on 100 parts by weight of the alkali-soluble macromolecular binder (A).

Optionally such a photopolymerization initiator (D) may be used in combination with one or more photosensitizers such as tertiary amines like N,N-(dimethylamino)ethyl benzoate, N,N-(dimethylamino)isoamyl benzoate, pentyl-4-dimethylamino benzoate, triethylamine, and triethanolamine.

Where the photo-curing depth is required to be greater, such a titanothene type photopolymerization initiator as the product of Ciba Specialty Chemicals K.K. (sold under the product code of "CGI784") which initiates radical polymerization in a visible region, 3-substituted coumarin dyestuff, and a leuco-dye may be optionally used as a curing aid in combination with the above photopolymerization initiator.

An organic solvent (E) is used for the purpose of diluting the photocurable composition into a pasty constitution capable of easy application to a substrate and enabling the applied layer of the paste to form on drying a film capable of contact exposure. Examples of the organic solvents include, but are not limited to: ketones such as methyl ethyl ketone and cyclohexanone; aromatic hydrocarbons such as toluene, xylene, and tetramethyl benzene; glycol ethers such as cellosolve, methyl cellosolve, carbitol, methyl carbitol, butyl carbitol, propylene glycol monomethyl ether, dipropylene glycol monomethyl ether, dipropylene glycol monoethyl ether, and triethylene glycol monoethyl ether; acetates such as ethyl acetate, butyl acetate, cellosolve acetate, butyl cellosolve acetate, carbitol acetate, butyl carbitol acetate, propylene glycol monomethylether acetate, and dipropylene glycol monomethylether acetate; aliphatic hydrocarbons such as octane and decane; and petroleum solvents such as petroleum ether, petroleum naphtha, hydrogenated petroleum naphtha, and solvent naphtha. These well known and widely used organic solvents may be used either singly or in the form of a combination of two or more members.

The organic solvent may be used in an amount capable of adjusting the viscosity of the photocurable composition to a desired level depending on the kind of method adopted for the application of the photocurable composition.

The photocurable composition according to the present invention, for the purpose of improving the storage stability of the composition, may incorporate therein a compound which is capable of forming a complex or a salt in conjunction with a metal or oxide powder, as the stabilizer.

Such acids as inorganic acids, organic acids, and phosphoric acid compounds (inorganic phosphoric acid and organic phosphoric acid) can be advantageously used as the stabilizer. Such a stabilizer is preferred to be incorporated in an amount of not more than 5 parts by weight, based on 100 parts by weight of the inorganic powder (B).

As concrete examples of the inorganic acid, nitric acid, sulfuric acid, hydrochloric acid, and boric acid may be cited.

As concrete examples of the organic acid, formic acid, acetic acid, acetoacetic acid, citric acid, isocitric acid, anisic acid, propionic acid, butyric acid, isobutyric acid, valeric acid, isovaleric acid, azelaic acid, caproic acid, isocaproic acid, enanthic acid, caprylic acid, pelargonic acid, undecanoic acid, laurylic acid, tridecanoic acid, myristic acid, palmitic acid, stearic acid, arachic acid, behenic acid, oxalic acid, malonic acid, ethylmalonic acid, succinic acid, glutaric acid, adipic acid, pimelic acid, pyruvic acid, piperonic acid, pyromellitic acid, suberic acid, azelaic acid, sebacic acid, maleic acid, fumaric acid, phthalic acid, isophthalic acid, terephthalic acid, tartaric acid, levulinic acid, lactic acid, benzoic acid, isopropylbenzoic acid, salicylic acid, isocaproic acid, crotonic acid, isocrotonic acid, acrylic acid, methacrylic acid, tiglic acid, ethylacrylic acid, ethylidene propionic acid, dimethylacrylic acid, citronellic acid, undeceneic acid, undecanoic acid, oleic acid, elaidic acid, erucic acid, brassidic acid, phenylacetic acid, cinnamic acid, methylcinnamic acid, naphthoeic acid, abietic acid, acetylene dicarboxylic acid, atrolactinic acid, itaconic acid, crotonic acid, sorbic acid, vanillic acid, palmitic acid, hydroxycinnamic acid, hydroxynaphtheic acid, hydroxybutyric acid, biphenyl dicarboxylic acid, phenylcinnamic acid, phenylacetic acid, phenylpropionic acid, phenoxyacetic acid, propionic acid, hexanic acid, heptanoic acid, veratric acid, benzilic acid, oxalosuccinic acid, oxaloacetic acid, octanoic acid, gallic acid, mandellic acid, messaconic acid, methylmaroic acid, mellitic acid, lauric acid, ricinoleic acid, linoleic acid, and malic acid may be cited.

As concrete examples of the inorganic phosphoric acid, phosphoric acid, phosphorous acid, hypophosphorous acid, orthophosphoric acid, diphoshoric acid, tripolyphospshoric acid, and phosphonic acid may be cited.

As concrete examples of the organic phosphoric acid, methyl phosphate, ethyl phosphate, propyl phosphate, butyl phosphate, phenyl phosphate, dimethyl phosphate, diethyl phosphate, dibutyl phosphate, dipropyl phosphate, diphenyl phosphate, isopropyl phosphate, diisopropyl phosphate, n-butyl phosphate, methyl phosphite, ethyl phosphite, propyl phosphite, butyl phosphite, phenyl phosphite, dimethyl phosphite, diethyl phosphite, dibutyl phosphite, dipropyl phosphite, diphenyl phosphite, isopropyl phosphite, diisopropyl phosphite, n-butyl-2-ethylhexyl phosphite, hydroxyethylene diphosphonic acid, adenosine triphosphoric acid, adenosin phosphoric acid, mono(2-methacryloyloxyethyl) acid phosphate, mono(2-acryloyloxyethyl) acid phosphate, di(2-methacryloyloxyethyl) acid phosphate, di(2-acryloyloxyethyl) acid phosphate, ethyldiethylphosphonoacetate, ethyl acid phosphate, butyl acid phosphate, butylpyrophosphate, butoxyethyl acid phosphate, 2-ethylhexyl acid phosphate, oleyl acid phosphate, tetracosyl acid phosphate, diethylene glycol acid phosphate, and (2-hydroxyethyl)methacrylate acid phosphate may be cited.

As other acids, such sulfonic acids as benzenesulfonic acid, toluenesulfonic acid, naphthalenesulfonic acid, ethane sulfonic acid, naphtholsulfonic acid, taurine, methanillic acid, sulfanilic acid, naphthylaminesulfonic acid, sulfobenzoic acid, and sulfamic acid are also usable.

The stabilizers enumerated above may be used either singly or in the form of a combination of two or more members.

The photocurable composition of the present invention may further incorporate therein, as occasion demands, such other additives as various pigments, particularly heat-resistant inorganic pigments, and silicone-based or acrylic anti-foaming agents and leveling agents in an amount incapable of impairing the desired properties of the composition. It may also incorporate therein, as occasion demands, a known and popularly used antioxidant for preventing the electroconductive metal powder from oxidation, a thermal polymerization inhibitor for improving the thermal stability during storage, and fine particles of metallic oxide, silicon oxide, or boric oxide as a binding component with the substrate during the calcining work.

The photocurable composition of the present invention can be used in the form of electroconductive paste, glass paste, or fluorescent paste as described above. It may be otherwise used in the form of a film. When the paste is used in its unmodified form, it is applied to a varying substrate of glass sheet or ceramic sheet by a suitable method such as screen printing method, curtain coating method, roll coating method, bar coating method, blade coating method, or die coating method. The applied layer of the paste is then dried with a hot air circulation type drying oven or a far infrared drying oven at a temperature in the approximate range of 60° to 120° C. for a period in the approximate range of 5 to 40 minutes, for example, to produce a tack-free coating film. Then, this film is subjected to selective exposure to light, development, and calcining to give rise to a conductor pattern, a vitreous dielectric pattern, or a fluorescent pattern as requested.

Figure 2A:
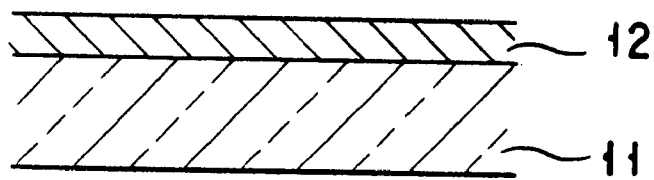
FIGS. 2A through 2D are fragmentary sectional side views for an explanation of process flow illustrating one embodiment of the method of the present invention.
Figure 2B:
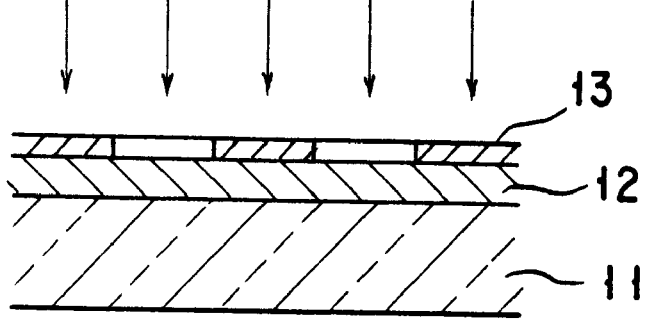
Figure 2C:
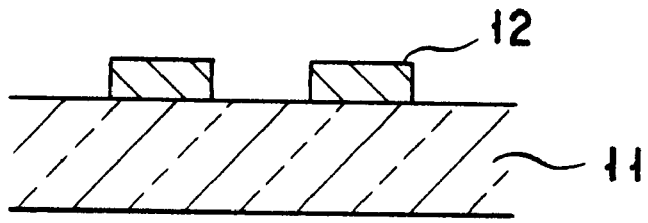
Figure 2D:
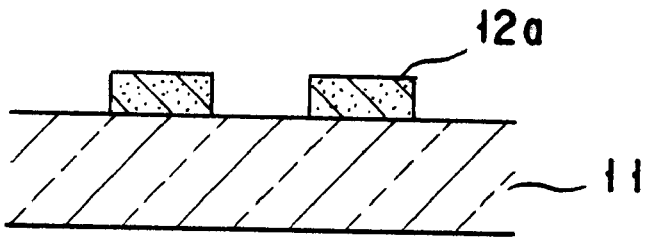

FIGS. 2A through 2D represent the mode using a photosensitive paste for the production of a calcined film. First, the photosensitive paste (conductive paste or insulating paste) is applied on such a transparent substrate 11 as glass substrate as illustrated in FIG. 2A and the applied layer of the paste is dried to produce a film 12 exhibiting good tack-free touch of finger. A photomask 13 containing a prescribed mask pattern is superposed on the film 12 and the film 12 is selectively exposed to light through the photomask 13 (FIG. 2B). After the removal of the photomask 13, the exposed film 12 is developed to remove the unexposed portions and assume the prescribed pattern (FIG. 2C). In this case, an aqueous alkaline solution, for example, is used as the developing solution. Thereafter, the patterned film 12 is treated at a prescribed temperature, depending on the photosensitive paste used herein, to effect removal of the binder and calcination and consequently form on the substrate 11 a patterned calcined film 12a (electrically conducting film or insulating film) of the inorganic material as illustrated in FIG. 2D.

The step of exposure can be accomplished by using a negative photomask containing a prescribed exposure pattern which is in contact with the dried layer (contact exposure) or out of contact with that layer (noncontact exposure). In terms of resolution, the contact exposure is preferred to the noncontact exposure. The exposure is preferred to be performed in the atmosphere of vacuum or nitrogen gas. The light sources which are usable for the exposure include a halogen lamp, a high-pressure mercury-vapor lamp, a laser beam, a metal halide lamp, a black lamp, and an electrodeless discharge lamp, for example. A preferred irradiation dose is in the approximate rage of 50 to 1,000 mJ/cm$^2$.

For the step of development, the spray method or the immersion method is used. As a developing solution, the aqueous solutions of such alkali metals as sodium hydroxide, potassium hydroxide, sodium carbonate, potassium carbonate, and sodium silicate and the aqueous solutions of amines such as monoethanolamine, diethanolamine, and triethanolamine can be used advantageously. A particularly advantageous developing solution is a dilute alkaline aqueous solution having a concentration not more than about 1.5% by weight. The developing solution is only required to saponify the carboxyl groups of the alkali-soluble macromolecular binder in the composition and permit removal of the uncured areas (unexposed areas) and, therefore, is not required to be limited to those examples cited above. After the step of development, the developed layer is preferred to be washed with water or neutralized with an acid for the removal of the unwanted residual developing solution.

At the calcining step, the substrate which has undergone the development is heat-treated in the air or an atmosphere of nitrogen at a temperature in the approximate range of 380° to 600° C. to melt the glass component and fix a required pattern such as the conductor pattern, vitreous dielectric pattern, and fluorescent pattern to the substrate. At this time, the step of calcining is preferred to be preceded by a step of heating the substrate to a temperature in the approximate range of 300° to 500° C. and keeping it at this temperature for a prescribed period thereby depriving the substrate of organic substances.

The alkali-developing type photocurable composition of the present invention, though developable with an aqueous alkaline solution, excels in viscosity stability (storage stability) and avoids bringing such problems as deteriorating the operational efficiency of coating work due to gelation or decline of flowability of the composition or degrading the pattern-forming properties due to decline of the developing properties as described above. The use of the photocurable composition of the present invention, therefore, enables such calcined patterns of high fineness as conductor pattern, vitreous dielectric pattern, and fluorescent pattern to be stably formed with high yield and satisfactory productivity on a substrate of a large surface area by the technique of photolithography without entailing such problems as deteriorating the working environment.

Now, the present invention will be described more specifically below by reference to working examples and comparative examples. Wherever "parts" and "%" are mentioned therein, they are based invariably on weight unless otherwise specified.

Synthetic Example 1

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing isobornyl methacrylate and glycidyl methacrylate at a molar ratio indicated in Table 1 added dropwise thereto over a period of about two hours were stirred together for one hour, and the resultant mixture was inactivated by being heated to 115° C. to obtain a resin solution.

This resin solution was cooled and then subjected to an addition reaction with butyric acid at a molar ratio indicated in Table 1 in an equivalent weight to the glycidyl groups of the resin in the presence of tetrabutylammonium bromide as a catalyst under the conditions of 95–105° C. and 30 hours. The resultant resin solution was cooled.

Further, tetrahydrophthalic anhydride was added to the resin solution and subjected to an addition reaction to the secondary OH groups of the produced resin at a molar ratio indicated in Table 1 under the conditions of 95–105° C. and 8 hours. The product of the addition reaction was cooled and extracted from the reaction system to obtain a resin solution A having a solids content of 50%.

Synthetic Example 2

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing isobornyl methacrylate and glycidyl methacrylate at a molar ratio indicated in Table 1 added dropwise thereto over a period of about two hours were stirred together for one hour, and the resultant mixture was inactivated by being heated to 115° C. to obtain a resin solution.

This resin solution was cooled and then subjected to an addition reaction with n-hexanoic acid at a molar ratio indicated in Table 1 in an equivalent weight to the glycidyl groups of the resin in the presence of tetrabutylammonium bromide as a catalyst under the conditions of 95–105° C. and 30 hours. The resultant resin solution was cooled.

Further, tetrahydrophthalic anhydride was added to the resin solution and subjected to an addition reaction to the secondary OH groups of the produced resin at a molar ratio indicated in Table 1 under the conditions of 95–105° C. and 8 hours. The product of the addition reaction was cooled and extracted from the reaction system to obtain a resin solution B having a solids content of 50%.

Comparative Synthetic Example 1

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing ethyl methacrylate, methacrylic acid, and 2-hydroxyethyl methacrylate at a molar ratio indicated in Table 2 added dropwise thereto over a period of about two hours were stirred together for one hour, and the resultant mixture was inactivated by being heated to 115° C. to obtain a resin solution C having a solids content of 50%.

Comparative Synthetic Example 2

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing ethyl methacrylate and 2-hydroxyethyl methacrylate at a molar ratio indicated in Table 2 added dropwise thereto over a period of about two hours were stirred together for one hour, and the resultant mixture was inactivated by being heated to 115° C. to obtain a resin solution.

This resin solution was cooled. Then tetrahydrophthalic anhydride was added to the resin solution and subjected to an addition reaction to the OH groups of the produced resin at a molar ratio indicated in Table 2 in the presence of tetrabutylammonium bromide as a catalyst under the conditions of 95–105° C. and 8 hours to obtain a resin solution D having a solids content of 50%.

The components and the properties of the resins obtained in Synthetic Examples 1 and 2 and Comparative Synthetic Examples 1 and 2 are shown in Table 1 and Table 2.

In the tables, IBX stands for isobornyl methacrylate, GMA for glycidyl methacrylate, THPA for tetrahydrophthalic anhydride, EMA for ethyl methacrylate, MA for methacrylic acid, and HEMA for 2-hydroxyethyl methacrylate. The produced resins were measured for weight-average molecular weight by the use of a high-speed system of liquid chromatography formed by connecting three columns (made by Showa Denko K.K. and sold under the registered trademark designations of "Shodex" KF-804, KF-603, and KF-802) to a pump (made by Shimadzu Seisakusho Ltd. and sold under the product code of "LC-6AD").

TABLE 1

| Components and properties | Synthetic Example 1 (Resin A) | Synthetic Example 2 (Resin B) |
| --- | --- | --- |
| Molar ratio of IBX | 0.4 | 0.4 |
| Molar ratio of GMA | 0.6 | 0.6 |
| Molar ratio of butyric acid added | 0.6 | — |
| Molar ratio of n-hexanoic acid added | — | 0.6 |
| Molar ratio of THPA | 0.42 | 0.45 |
| Weight-average molar weight, Mw | 15000 | 20000 |
| Acid value (mgKOH/g) | 80 | 80 |

TABLE 2

| Components and properties | Comparative Synthetic Example 1 (Resin C) | Comparative Synthetic Example 2 (Resin D) |
| --- | --- | --- |
| Molar ratio of EMA | 0.67 | 0.4 |
| Molar ratio of MA | 0.15 | — |
| Molar ratio of HEMA | 0.18 | 0.6 |
| Molar ratio of THPA added | — | 0.2 |
| Weight-average molar weight, Mw | 20000 | 20000 |
| Acid value (mgKOH/g) | 78 | 73 |

Photocurable paste compositions were manufactured by using the resins obtained in Synthetic Examples 1 and 2 and Comparative Synthetic Examples 1 and 2 mentioned above, compounding them respectively with other components at percentage compositions which will be described herein below, stirring the resultant compositions, kneading the resultant mixtures by the use of a three-roll mill, and reducing them to a constitution of paste.

The glass frit used in these experiments had a composition of 60% of PbO, 20% of $B_2O_3$, 15% of $SiO_2$, and 5% of $Al_2O_3$, a thermal expansion coefficient, $\alpha_{300}$, of $70\times10^{-7}/°$ C., a glass transition temperature of 445° C., and an average particle diameter of 2.5 μm. The black pigment used herein was a Cu—Cr—Mn oxide having an average particle diameter of 0.5 μm. The electroconductive metal powder used herein was a powder of silver spheres having an average particle diameter of 1 μm and prepared for use by a treatment using a fatty acid-based surface-treating agent. The surface treatment with the fatty acid was performed by adding 400 wt. % of the silver powder into a solution of 1 wt. % of linoleic acid in a mixed solution consisting of water and isopropanol at a ratio of 1:1, stirring them together, distilling the resultant mixture thereby expelling the solvent by evaporation, and heating the residue at 70° C. for three hours.

| Composition Example 1 | |
| --- | --- |
| Resin solution A | 200 parts |
| Pentaerythritol triacrylate | 50 parts |
| 2-Benzyl-2-dimethylamino-1-(4-morpholinophenyl)-butan-1-one | 10 parts |
| Black pigment | 150 parts |
| Glass frit | 500 parts |
| Composition Example 2 | |
| Resin solution B | 200 parts |
| Trimethylolpropane triacrylate | 50 parts |
| 2-Benzyl-2-dimethylamino-1-(4-morpholinophenyl)-butan-1-one | 15 parts |
| Silver powder | 150 parts |
| Black pigment | 100 parts |
| Glass frit | 25 parts |
| Composition Example 3 | |
| Resin solution B | 200 parts |
| Pentaerythritol triacrylate | 70 parts |
| 2-Benzyl-2-dimethylamino-1-(4-morpholinophenyl)-butan-1-one | 10 parts |
| Black pigment | 150 parts |
| Glass frit | 500 parts |
| Comparative Composition Example 1 | |
| Resin solution C | 200 parts |
| Pentaerythritol triacrylate | 50 parts |
| 2-Benzyl-2-dimethylamino-1-(4-morpholinophenyl)-butan-1-one | 10 parts |
| Black pigment | 150 parts |
| Glass frit | 500 parts |
| Comparative Composition Example 2 | |
| Resin solution C | 200 parts |
| Trimethylolpropane triacrylate | 50 parts |
| 2-Benzyl-2-dimethylamino-1-(4-morpholinophenyl)-butan-1-one | 15 parts |
| Silver powder | 150 parts |
| Black pigment | 100 parts |
| Glass frit | 25 parts |
| Comparative Composition Example 3 | |
| Resin solution D | 200 parts |
| Pentaerythritol triacrylate | 50 parts |
| 2-Benzyl-2-dimethylamino-1-(4-morpholinophenyl)-butan-1-one | 10 parts |
| Black pigment | 150 parts |
| Glass frit | 500 parts |

The photocurable paste compositions of Composition Examples 1–3 and Comparative Composition Examples 1–3 were stored at 25° C. and rated for storage stability (viscosity stability after 24 hours' and one week's standing).

Stripes of lines were formed of the photocurable paste compositions of Composition Examples 1–3 and Comparative Composition Examples 1–3 each on a glass substrate and rated for developing properties (by direct visual observation of the substrates after the development and visual observation of the light passed through the substrate from behind) and the lines which had undergone the calcining were rated for retention of shape.

The formation of the striped pattern of lines was performed by the following procedure. For a start, a given composition one—three hours old or one week old from the time of manufacture was applied to the entire surface of a glass substrate through a 300-mesh polyester screen. Then, by the use of a negative film having a striped pattern adapted to form a line width of 100 μm and a space width of 100 μm, the applied layer of the composition was exposed to the light emitted from a metal halide lamp so as to amount to an exposed dose of 500 mJ/cm² accumulated on the composition. Thereafter, the exposed film was developed with an aqueous $Na_2CO_3$ solution kept at a temperature of 30° C. and then rinsed with water. Finally, the developed film was placed in an electric oven and calcined in the air. The calcining was carried out by a process which comprised elevating the temperature from the room temperature to 450° C. at a rate of temperature increase of 5° C./minute, keeping the temperature at 450° C. for 30 minutes, thereafter elevating the temperature to 550° C. at a rate of temperature increase of 5° C./minute, keeping the temperature at this level for 30 minutes to calcine the film, and subsequently allowing the hot film to cool off to room temperature.

The substrates consequently obtained were tested for various properties and the results of the test were rated. The results of the rating are shown in Table 3.

TABLE 3

| Properties | Composition Examples | | | Comparative Composition Examples | | |
|---|---|---|---|---|---|---|
| | 1 | 2 | 3 | 1 | 2 | 3 |
| Storage stability | | | | | | |
| After 24 hours | ○ | ○ | ○ | Δ | Δ | X |
| After one week | Δ | ○ | ○ | X | X | X |
| Developing properties | | | | | | |
| After one–three hours | ○ | ○ | ○ | ○ | ○ | ○ |
| After one week | ○ | ○ | ○ | Δ | Δ | X |
| Shape of lines after calcining | | | | | | |
| After one–three hours | ○ | ○ | ○ | ○ | ○ | ○ |
| After one week | ○ | ○ | ○ | Δ | Δ | —*) |

Remark
*)The sample bearing the mark "X" for developing properties was in such a state as to defy all efforts to perform rating.

The following properties indicated in Table 3 were rated on the following scales.

Storage stability:
○: Less than 10% of increase in viscosity
Δ: Not less than 10% and less than 30% of increase in viscosity
x: Not less than 30% of increase in viscosity Developing properties:
○: Stable survival of lines and absence of residual paste in the space part
Δ: Separation of less than 10% of the whole of lines or presence of slight residue of paste between lines after the development
x: Separation of not less than 10% of the whole of lines or presence of clear residue of paste (opaque in observation with the light of transmission) between lines after the development Shape of lines after calcining;
○: Absence of warp or separation in cross section of stripe pattern
Δ: Presence of slight warp in cross section of stripe pattern and separation of less than 10%
x: Presence of clear warp in cross section of stripe pattern and separation of not less than 10%

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photocurable composition developable with an aqueous alkaline solution, comprising in combination:
(A) an alkali-soluble macromolecular binder having a weight-average molecular weight in the range of 5,000 to 100,000 and an acid value in the range of 50 to 150 mg KOH/g and obtained by causing (c) an organic acid possessing one carboxyl group and no ethylenically unsaturated bond in its molecule to react with the glycidyl group of a copolymer of (a) a compound possessing an ethylenically unsaturated bond and possessing neither hydroxyl group nor acidic group and (b) glycidyl (meth)acrylate and then causing (d) a polybasic acid anhydride to react with the resultant secondary hydroxyl group,
(B) an inorganic powder,
(C) a photopolymerizable monomer,
(D) a photopolymerization initiator, and
(E) an organic solvent.

2. The composition according to claim 1, wherein said compound (a) possessing an ethylenically unsaturated bond and possessing neither hydroxyl group nor acidic group is selected from the group consisting of alkyl (meth)acrylates and unsubstituted or substituted styrenes.

3. The composition according to claim 1, wherein said organic acid (c) possessing one carboxyl group and no ethylenically unsaturated bond in its molecule is selected from the group consisting of alkylcarboxylic acids having 2 to 17 carbon atoms, substituted or unsubstituted benzoic acid, and aromatic group-containing alkylcarboxylic acids.

4. The composition according to claim 1, wherein said polybasic acid anhydride (d) is selected from the group consisting of maleic anhydride, succinic anhydride, phthalic anhydride, tetrahydrophthalic anhydride, hexahydrophthalic anhydride, methyltetrahydrophthalic anhydride, methylhexahydrophthalic anhydride, methylendomethylenetetrahydrophthalic anhydride, endomethylenetetrahydrophthalic anhydride, chlorendic anhydride, and trimellitic anhydride.

5. The composition according to claim 1, wherein said alkali-soluble macromolecular binder (A) is present in an amount of 5 to 50% by weight of the total amount of the composition.

6. The composition according to claim 1, wherein said inorganic powder (B) incorporates therein a low melting glass frit in an amount accounting for a portion of not less than 5% by weight thereof.

7. The composition according to claim 6, wherein said low melting glass frit is selected from the group consisting of:
an amorphous frit which has a composition (in percent by weight of oxide basis) 48–82% of PbO, 0.5–22% of $B_2O_3$, 3–32% of $SiO_2$, 0–12% of $Al_2O_3$, 0–10% of BaO, 0–15% of ZnO, 0–2.5% of $TiO_2$, and 0–25% of $Bi_2O_3$ and has a softening point in the range of 420–590° C.,
an amorphous frit which has a composition (in percent by weight of oxide basis) 35–88% of $Bi_2O_3$, 5–30% of $B_2O_3$, 0–20% of $SiO_2$, 0–5% of $Al_2O_3$, 1–25% of BaO, and 1–20% of ZnO and has a softening point in the range of 420–590° C., and
an amorphous frit which has a composition of (in percent by weight of oxide basis) 25–60% of ZnO, 2–15% of $K_2O$, 25–45% of $B_2O_3$, 1–7% of $Si_2$, 0–10% of $Al_2O_2$, 0–20% of BaO, and 0–10% of MgO and has a softening point in the range of 420–590° C.

8. The composition according to claim 1, wherein said inorganic powder (B) is at least one member selected from the group consisting of a metal powder, a glass powder, and a black pigment.

9. The composition according to claim 1, wherein said inorganic powder (B) comprises an electroconductive metal powder containing at least one element selected from the group consisting of Ag, Au, Pd, Ni, Cu, Al, Pt, and alloy thereof.

10. The composition according to claim 8, wherein said metal powder has an average particle diameter of not more than 10 microns and is present in an amount of 25 to 1,000 parts by weight, based on 100 parts by weight of said alkali-soluble macromolecular binder (A).

11. The composition according to claim 8, wherein said glass powder has an average particle diameter of not more than 10 microns and a softening point of 300° to 600° C. and is present in an amount of 25 to 1,000 parts by weight, based on 100 parts by weight of of said alkali-soluble macromolecular binder (A).

12. The composition according to claim 1, wherein said inorganic powder (B) comprises a black pigment formed of a metal oxide containing as a main component thereof at least one element selected from the group consisting of Fe, Co, Cu, Cr, Mn, and Al.

13. The composition according to claim 1, wherein said inorganic powder (B) contains at least one compound selected from the group consisting of alumina, cordierite, and zircon.

14. The composition according to claim 1, wherein said photopolymerizable monomer (C) is present in an amount of 1 to 200 parts by weight, based on 100 parts by weight of said alkali-soluble macromolecular binder (A).

15. The composition according to claim 1, wherein said photopolymerization initiator (D) is present in an amount of 1 to 20 parts by weight, based on 100 parts by weight of said alkali-soluble macromolecular binder (A).

16. The composition according to claim 1, further comprising at least one stabilizer selected from the group consisting of inorganic acids, organic acids, inorganic phosphoric acids, and organic phosphoric acids.

17. The composition according to claim 16, wherein said stabilizer is present in an mount of 0.1 to 5 parts by weight, based on 100 parts by weight of said inorganic powder (B).

18. The composition according to claim 1, which is in the form of paste.

19. The composition according to claim 1, which is formed in the form of film.

20. A calcined pattern obtained by patterning a film of a photocurable composition according to claim 1 formed in close adhesion on a substrate and then calcining the patterned film.

* * * * *